(12) United States Patent
Sugaya

(10) Patent No.: US 8,436,465 B2
(45) Date of Patent: May 7, 2013

(54) SEMICONDUCTOR DEVICE AND METHOD FOR MANUFACTURING THE SEMICONDUCTOR DEVICE

(75) Inventor: Isao Sugaya, Kawasaki (JP)

(73) Assignee: Nikon Corporation, Tokyo (JP)

( * ) Notice: Subject to any disclaimer, the term of this patent is extended or adjusted under 35 U.S.C. 154(b) by 286 days.

(21) Appl. No.: 12/529,925

(22) PCT Filed: Mar. 3, 2008

(86) PCT No.: PCT/JP2008/053768
§ 371 (c)(1),
(2), (4) Date: Sep. 4, 2009

(87) PCT Pub. No.: WO2008/108334
PCT Pub. Date: Sep. 12, 2008

(65) Prior Publication Data
US 2010/0109154 A1 May 6, 2010

(30) Foreign Application Priority Data

Mar. 6, 2007 (JP) ................................. 2007-055351
Mar. 30, 2007 (JP) ................................. 2007-091083

(51) Int. Cl.
*H01L 23/34* (2006.01)
*H01L 21/00* (2006.01)

(52) U.S. Cl.
USPC ........... 257/712; 257/713; 257/686; 257/722; 257/777; 438/107; 438/109; 438/122; 361/709

(58) Field of Classification Search ................. 257/796, 257/686, E25.006, E25.013, E25.021, E25.027, 257/E23.085, 276, 625, 675, 706, 707, 712–722, E33.075, E31.131, E23.08–E23.113, 777, E25.005, E25.018, 698, E23.051, E23.169–E23.178, 773, 774; 438/109, 107, 122; 361/679.54, 361/704, 709, 730, 735, 783

See application file for complete search history.

(56) References Cited

U.S. PATENT DOCUMENTS

| | | | |
|---|---|---|---|
| 5,229,647 A * | 7/1993 | Gnadinger | 257/785 |
| 5,936,837 A * | 8/1999 | Scribner et al. | 361/704 |
| 6,936,929 B1 * | 8/2005 | Mostafazadeh et al. | 257/778 |
| 8,106,497 B2 * | 1/2012 | Brunnbauer et al. | 257/686 |
| 2003/0011053 A1 * | 1/2003 | Yasunaga | 257/678 |
| 2006/0197181 A1 * | 9/2006 | Noguchi | 257/530 |

FOREIGN PATENT DOCUMENTS

| | | |
|---|---|---|
| JP | 62-81735 | 4/1987 |
| JP | 1-73995 | 5/1989 |
| JP | 2005-244143 | 9/2005 |
| JP | 2006-108130 | 4/2006 |
| JP | 2006-210892 | 8/2006 |
| JP | 2006-319243 | 11/2006 |

* cited by examiner

*Primary Examiner* — Jasmine Clark
(74) *Attorney, Agent, or Firm* — Finnegan, Henderson, Farabow, Garrett & Dunner, L.L.P.

(57) ABSTRACT

At least a part of a heat radiation member (9) connected to a DRAM (11) for radiating heat of the DRAM (11) is exposed from a protection member (4) arranged to surround the DRAM and the heat radiation member (9) so as to protect the DRAM (11). Thus, it is possible to provide a semiconductor device having a preferable heat radiation performance.

13 Claims, 7 Drawing Sheets

SEMICONDUCTOR DEVICE AND METHOD FOR MANUFACTURING THE SEMICONDUCTOR DEVICE

CROSS-REFERENCE TO RELATED APPLICATIONS

This application is a national phase application of International Application No. PCT/JP2008/053768, filed Mar. 3, 2008, and claims the priority of Japanese Application Nos. 2007-055351, filed Mar. 6, 2007, and 2007-091083, filed Mar. 30, 2007, the contents of all of which are incorporated herein by reference.

TECHNICAL FIELD

The present invention relates to a semiconductor device and a method for manufacturing the semiconductor device.

BACKGROUND ART

Conventionally, a semiconductor device comprising a substrate on which a circuit pattern is formed and a protection member, disposed to surround the substrate, for protecting the substrate is known. In such a semiconductor device, a heat radiating member for radiating heat generated in the substrate is adhered to the surface of the protection member through an adhesive layer.

DISCLOSURE OF THE INVENTION

Heat of the substrate is transferred to the heat radiating member through the protection member and the adhesive layer because the protection layer and the adhesive layer are interposed between the substrate and the heat radiating member. The protection layer and the adhesive layer are the thermal resistance, which deteriorates the heat radiation performance from the substrate.

In view of the foregoing, one object of the present invention is to provide a semiconductor device with high heat radiation performance and a method for manufacturing the semiconductor device.

In accordance with one aspect of the present invention, a substrate, a heat radiating member joined to the substrate and radiating heat of the substrate, and a protection member surrounding the substrate and the heat radiating member for protecting the substrate are provided. At least a part of the heat radiating member is exposed from the protection member.

In accordance with another aspect of the present invention, superimposing a substrate through which one or more penetrating members used for heat transfer are provided and a heat radiating member for radiating heat of the substrate on each other, coupling the penetrating members to the heat radiating member while keeping the substrate and the heat radiating member superimposed on each other, having the substrate and the heat radiating member joined to each other through the penetrating members, surrounded with a protection member, and exposing at least a part of the heat radiating member from the protection member by removing a part of the protection member are included.

According to the present invention, heat generated in the substrate is transferred to the heat radiating member without passing through a protection member or an adhesive layer and then radiated by the heat radiating member. Therefore, heat generated in the substrate can be efficiently radiated without upsizing the semiconductor device.

Figure 1:
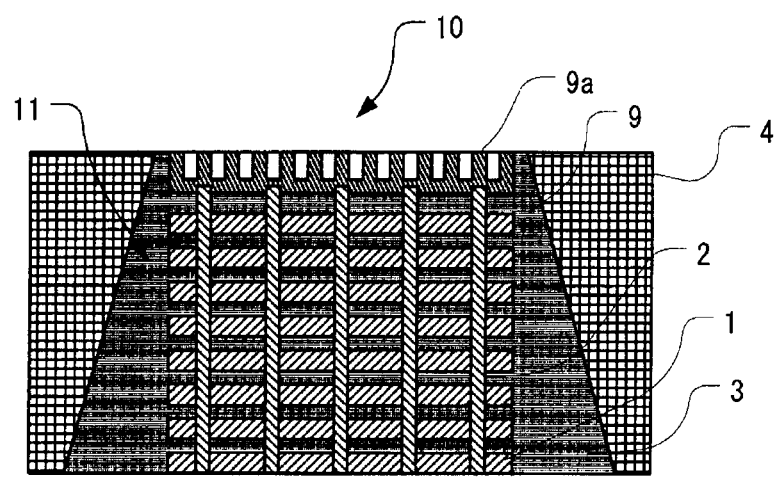
FIG. 1 is a view schematically showing a semiconductor device according to a first embodiment of the present invention.

EXPLANATIONS OF LETTERS OR NUMERALS 1 semiconductor chip
1a surface of semiconductor chip
1b back of semiconductor chip
11 substrate (DRAM)
2 penetrating member for heat transfer (thermal via)
3 resin adhesive (underfill)
4 protection member (overmold)
5 interposer
7 adhesive layer
8 heat radiating member
9 dummy layer
9a surface of heat radiating member
10 semiconductor device
11 DRAM
12 plate member
13 hole
14 thermal conductor
15 semiconductor device
16 projections and depressions

BEST MODE FOR CARRYING OUT THE INVENTION

Exemplary embodiments of the present invention will be described below with reference to the drawings. In the following discussion, the exemplary embodiments in which the present invention is applied to a semiconductor device 10 having a three-dimensional structure are shown.

The semiconductor device 10 according to this embodiment comprises a DRAM 11 as shown in FIG. 1.

In the example shown in the figure, the DRAM 11 has eight sheets of semiconductor chips 1 each on which a DRAM circuit pattern is formed. Each semiconductor chip 1 is formed by separating a wafer (not shown in the figure) of, for example silicon, into a plurality of regions each on which a circuit pattern is formed. The semiconductor chips 1 are stacked with spacings therebetween. Furthermore, the semiconductor chips 1 are connected by metal wiring (not shown in the figure) for electrically connecting between the semiconductor chips 1. A plurality of thermal vias 2 used for heat transfer are provided in each semiconductor chip 1 in such a manner as to penetrate the semiconductor chip. Each thermal via 2 is formed from a material having a high thermal conductivity such as copper or poly-silicon. In the case where each thermal via 2 is formed from copper, the thermal conductivity is 392 W/m° C. In the case where each thermal via 2 is formed from poly-silicon, the thermal conductivity is 148 W/m° C.

The semiconductor device 10 comprises an underfill 3 disposed to surround the DRAM. The underfill 3 is formed from epoxy resin having adhesion such as, for example, aliphatic epoxy resin or ether epoxy resin. The underfill 3 acts to reinforce the semiconductor device 10 by filling the spacings between the semiconductor chips 1 and protect the DRAM 11. The thermal conductivity of the underfill 3 is 0.7 W/m° C. in the example of the figure. The semiconductor device 10 further comprises an overmold 4 that is a protection member for protecting each semiconductor chip 1. The overmoled 4 is formed from, for example epoxy resin and ceramic, and is disposed to surround the outside of the underfill 3. The thermal conductivity of the overmold 4 is 0.7 W/m° C. in the example of the figure.

Above a top-layer semiconductor chip 1 of the stacked eight sheets of the semiconductor chips 1 that structure the DRAM 11, a heat radiating member 9 is disposed. In the example of the figure, the heat radiating member 9 is a plate member formed from, for example metal and ceramic, and is disposed substantially parallel to the top-layer semiconductor chip 1. The heat radiating member 9 is coupled to each thermal via 2. Thus, the heat radiating member 9 is joined to the DRAM 11 through each thermal via 2.

In the example of the figure, the heat radiating member surface side of the underfill 3 and the overmold 4 is removed so that the surface of the heat radiating member 9 is exposed from the underfill 3 and the overmold 4 to the external of the semiconductor device 10. Concavo-convex portions are provided on the surface 9a of the heat radiating member 9, which enables the area in which the heat radiating member 9 contacts the atmosphere to be larger, and hence the heat radiation area to be larger.

Heat generated from each semiconductor chip 1 is transferred to the heat radiating member 9 through each thermal via 2 and then radiated to the atmosphere from the surface 9a of the heat radiating member 9. In the case where a logic LSI such as a CPU or a GPU (not shown in the figure) is connected to the DRAM 11, a part of heat generated from the logic LSI is transferred to the heat radiating member 9 through each thermal via 2 and then radiated to the atmosphere from the surface 9a of the heat radiating member 9. In order to improve the heat radiation efficiency, a fluid that is a heat medium may be flowed on the surface 9a of the heat radiating member 9 so that the fluid carries the heat away.

Figure 2:
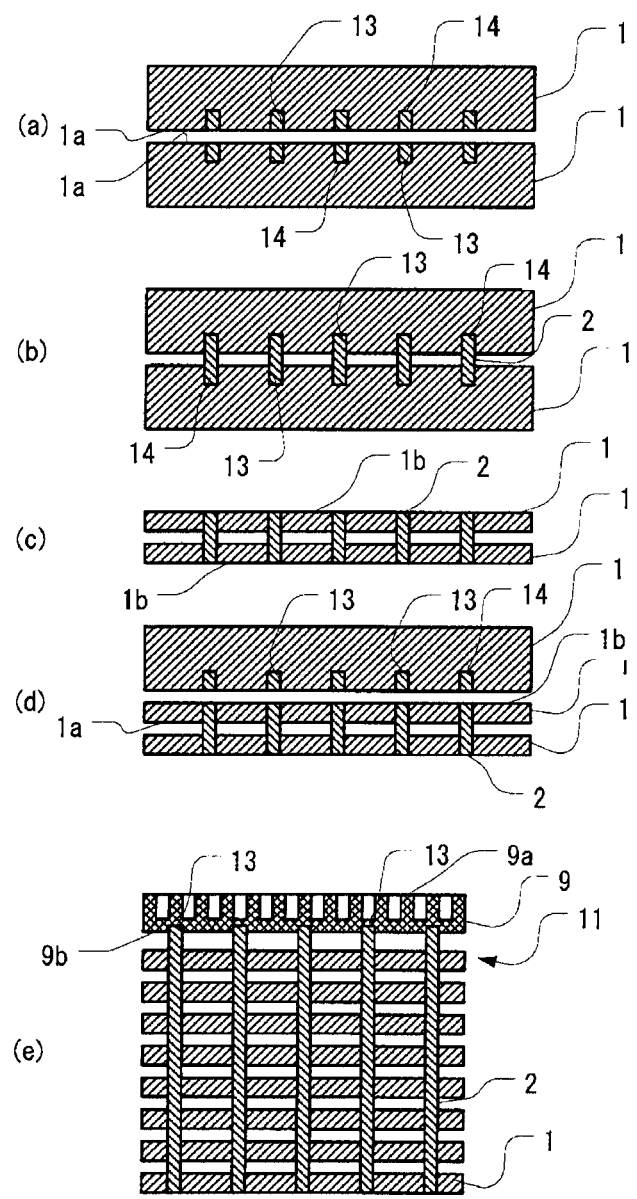
FIG. 2 is a view showing a method for manufacturing a semiconductor device shown in FIG. 1.

A method for manufacturing the semiconductor device 10 shown in FIG. 1 will be described referring to FIGS. 2 and 3, In order to manufacture the semiconductor device 10, a hole 13 for the thermal via 2 is formed by etching at each of a plurality of positions on a surface 1a of one of two semiconductor chips 1 and at each of a plurality of corresponding positions on a surface 1a of the other of the two semiconductor chips 1. As shown in FIG. 2(a), the two semiconductor chips 1 are positioned in such a manner that the holes 13 of the one of the semiconductor chips 1 faces the corresponding holes 13 of the other of the semiconductor chips 1. Each hole 13 is filled with a thermal conductor 14 such as copper or poly-silicon. Next, as shown in FIG. 2(b), the thermal conductor 14 filled in each hole 13 of the one of the semiconductor chips 1 is coupled to the thermal conductor 14 filled in the corresponding hole 13 of the other of the semiconductor chips 1 by applying plating. Thus, the both semiconductor chips 1 are joined to each other. As shown in FIG. 2(c), the back 1b of each semiconductor chip 1 is grinded to reduce the thickness of the semiconductor chip 1 so that the thermal conductor 14 filled in each hole 13 is exposed. Thus, a plurality of thermal vias 2 penetrating the stacked two semiconductor chips 1 are formed while a two-layered structure is formed. Then, as shown in FIG. 2(d), a surface 1a of a new semiconductor chip 1 on which each hole 13 is formed is positioned to face the back 1b of one of the above two semiconductor chips 1. Thus, a three-layered structure in which a plurality of thermal vias 2 are formed is formed by similar means as described above. A similar operation is repeated to form the DRAM 11 by stacking the eight sheets of semiconductor chips 1.

In the example of the figure, the DRAM 11 and the heat radiating member 9 are joined to each other after the DRAM 11 is formed. Here, each hole 13 is previously formed at a position corresponding to each thermal via 2 on the back 9b of the heat radiating member 9 (see FIG. 2(e)). The heat radiating member 9 is positioned in such a manner that the back of the heat radiating member 9 faces the top-layer semiconductor chip 1 of the DRAM 11. Next, each hole 13 of the heat radiating member 9 is filed with a thermal conductor 14. The thermal conductor 14 filled in each hole 13 on the heat radiating member 9 is coupled to the corresponding thermal via 2 by plating. Thus, as shown in FIG. 2(e), the DRAM 11 to which the heat radiating member 9 is joined through each thermal via 2 is completed. The heat radiating member 9 according to the present invention structures a dummy layer continuously stacked on the plurality of semiconductor chips 1 forming the DRAM 11. In the case where a conductive metal that can be plated is used as the heat radiating member 9, it is not required to provide the holes 13 in the dummy layer 9. In such a case, the heat radiating member 9 can be directly joined to the top-layer semiconductor chip 1 by, for example, adhesive material.

Thereafter, the layered structure having the DRAM 11 and the heat radiating member 9 stacked on the DRAM 11 is housed in a mold (not shown in the figure). The underfill 3 of liquid adhesive resin is poured into the mold to fill spaces between the semiconductor chips 1 and a space between the DRAM 11 and the heat radiating member 9 while having the layered structure surrounded with the underfill 3. Then, the underfill 3 is hardened to complete the layered structure surrounded with the underfill 3 as shown in FIG. 3(a). Furthermore, this structure is housed in a moled (not shown in the figure). The overmold 4 of liquid resin is poured into the mold to have this structure surrounded with the overmold 4. Then, the overmold 4 is hardened to complete the structure with the underfill 3 surrounded with the overmold 4 as shown in FIG. 3(b).

Finally, the overmold 4 and the underfill 3 in the upper portion of this structure are removed by grinding to expose the surface 9a of the heat radiating member 9 from the overmold 4 and the underfill 3. Furthermore, the underfill 3 within the concave portions on the surface 9a of the heat radiating member 9 is dissolved by solvent to complete the semiconductor device 10 as shown in FIG. 3(c).

According to this embodiment, the heat radiating member 9 is joined to the top-layer semiconductor chip 1 of the plurality of semiconductor chips 1 forming the DRAM 11, and the surface of the heat radiating member 9 is exposed from the underfill 3 and the overmold 4 as described above.

Figure 6:
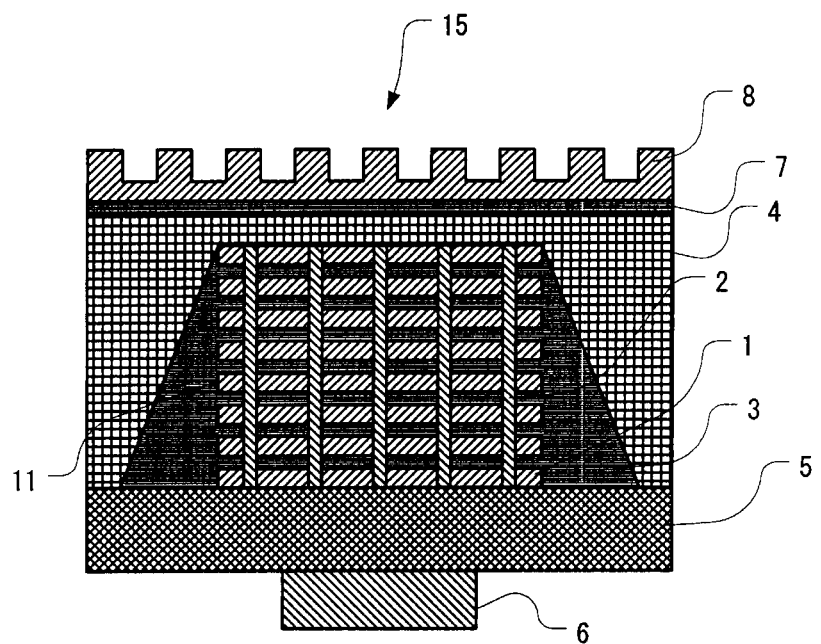
FIG. 6 is a view showing a comparison example with respect to a semiconductor device according to the present invention.

For example, as shown in a semiconductor device 15 in FIG. 6, in the case where the DRAM 11 having a plurality of semiconductor chips 1 is surrounded with the overmold 4 and a heat radiating plate 8 is adhered to the surface of the overmold 4 through an adhesive layer 7, heat of the DRAM 11 is transferred to the heat radiating plate 8 through the overmold 4 and the adhesive layer 7, which deteriorates the heat radiation efficiency. The heat radiation performance is improved to some extent if the size of the heat radiating plate 8 is increased, but which may bring the aim of downsizing the semiconductor device by stacking the semiconductor chips 1 to naught. Furthermore, although the heat radiation performance is improved by increasing a wind velocity of cooling air, there are problems that power consumption of a ventilating fan is increased and the noise is increased. In the example shown in FIG. 6, a logic LSI 6 is disposed below the DRAM 11. The logic LSI 6 is connected to the DRAM through an interposer 5. The interposer 5 is for providing a wiring interface between the DRAM and the logic LSI 6.

In contrast, according to the embodiment of the present invention, heat generated in each semiconductor chip 1 can be transferred to the heat radiating member 9 without passing through the overmold 4 or adhesive layer 7 as shown in FIG. 6 and then radiated from the heat radiating member 9. Thus, heat generated in the DRAM 11 can be efficiently radiated without upsizing the semiconductor device 10.

According to the embodiment of the present invention, a plurality of thermal vias 2 having a significantly higher thermal conductivity than those of the underfill 3 and the overmold 4 are provided in each semiconductor chip 1, and the heat radiating member 9 is coupled to each thermal via 2, as described above. Therefore, heat generated in each semiconductor chip 1 can be more surely transferred to the heat radiating member 9.

Furthermore, according to the embodiment of the present invention, in the stacking process for the plurality of semiconductor chips 1, the heat radiating member 9 is joined to the top-layer semiconductor chip 1 in a similar way to the stacking method for each semiconductor chip 1. Therefore, the heat radiating member 9 can be more easily assembled to the DRAM 11 as compared to the case where the heat radiating member 9 is joined to the DRAM 11 after the underfill 3 and the overmold 4 are formed in the surrounding of the DRAM 11.

In the case where the heat radiating member 9 and each thermal. via 2 are formed from metal, it is required to apply heat to the heat radiating member 9 and each thermal via 2 when they are joined. In the embodiment of the present invention, because the heat radiating member 9 and each thermal via 2 are joined prior to forming the underfill 3 and the overmold 4 in the surrounding of the DRAM 11, it is prevented that the underfill 3 and the overmold 4 formed from resin are dissolved due to the heat for joining the heat radiating member 9 and each thermal via 2.

In contrast, in the case where each thermal via 2 of the top-layer semiconductor chip 1 of the DRAM 11 is exposed after the underfill 3 and the overmold 4 are formed in the surrounding of the DRAM 11, and then the heat radiating member 9 is joined to the semiconductor chip 1, the underfill 4 and the overmold 4 formed from resin may be dissolved by heat applied for the metal joining.

Figure 3:
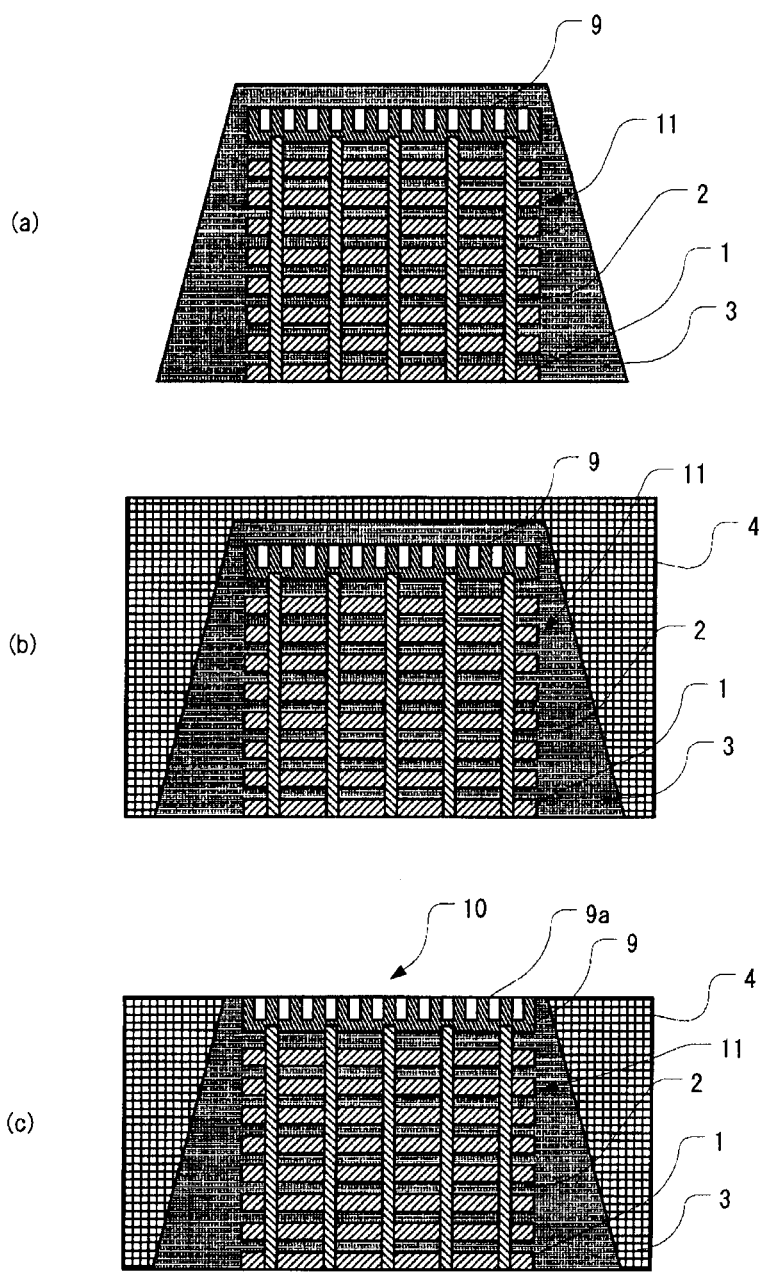
FIG. 3 is a view showing a method for manufacturing a semiconductor device shown in FIG. 1.

In the example shown in FIGS. 1 through 3, a plurality of holes 13 are formed in the back 9b of the heat radiating member 9 and the holes 13 are filled with thermal conductors 14, which are coupled to the corresponding thermal conductors on the top-layer semiconductor chip 1 by plating. Alternatively, the thermal conductors 14 on the top-layer semiconductor chip 1 may be directly joined to the back 9b of the heat radiating member 9 without forming the holes 13 on the back 9b of the heat radiating member 9.

Furthermore, in the example shown in FIGS. 1 through 3, the semiconductor chips 1 are coupled with each other when the DRAM 11 is formed. Alternatively, after a plurality of the wafers are stacked and joined. to each other, the stacked wafers may be separated into a plurality of regions to form the DRAM 11.

In the example shown in FIGS. 1 through 3, the surface 9a of the heat radiating member 9 is exposed from the overmold 4 and the underfill 3. In place of, or in addition to this, the side surface of the heat radiating member 9 may be exposed from the overmold 4 and the underfill 3, or the entire or a part of the surface 9a of the heat radiating member 9 may be exposed from the overmold 4 and the underfill 3.

Figure 4:
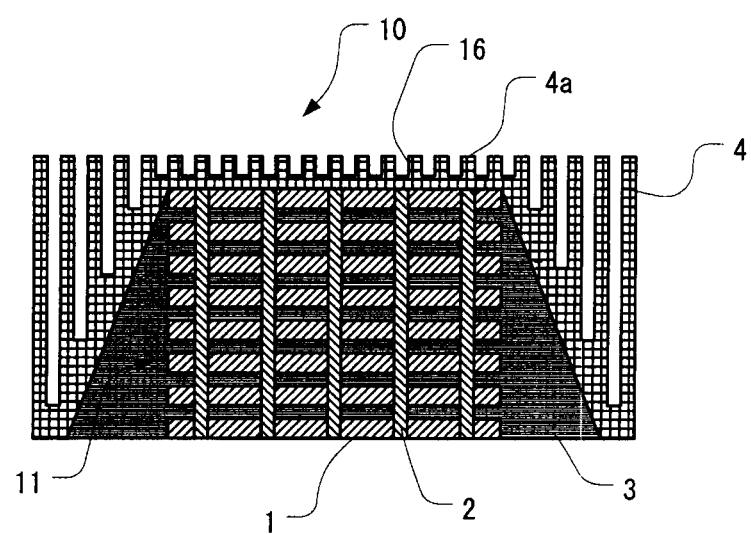
FIG. 4 is a view schematically showing a semiconductor device according to a second embodiment of the present invention.

FIG. 4 schematically shows a semiconductor device according to a second embodiment of the present invention. In this semiconductor device 10, the heat radiating member 9 as shown in FIGS. 1 through 3 is not provided. Projections and depressions 16 are provided on a surface 4a of the overmold 4. Therefore, the surface area of the overmold 4 is increased, from which heat of the DRAM 11 is directly radiated. Unlike a conventional case where a heat radiating member is attached to the surface 4a of the overmold 4, an adhesive layer is not required. Thus, the heat radiation efficiency can be surely improved as compared to the case where heat is transferred to the heat radiating member through the adhesive layer and the overmold.

In FIG. 4, the surface area of the overmold 4 is increased by forming excessively large projections and depressions 16. Alternatively, the surface area of the overmold 4 may be increased by making the surface 4a of the overmold 4 uneven by applying mechanical processing such as shot blasting or applying chemical processing such as etching.

Figure 5:
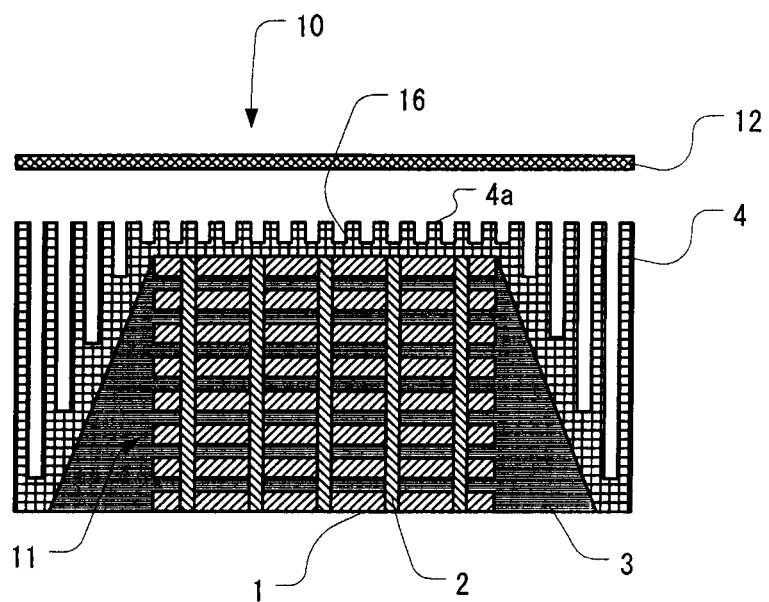
FIG. 5 is a view schematically showing a semiconductor device according to a third embodiment of the present invention.

FIG. 5 schematically shows a semiconductor device 10 according to a third embodiment of the present invention. In this semiconductor device 10, a plate member 12 is disposed above the surface 4a of the overmold 4 shown in FIG. 4 in such a manner as to be spaced apart from the surface 4a of the overmold 4 and substantially parallel to the surface 4a. If cooling fluid is flowed between the overmold 4 and the plate member 12, turbulence occurs. Therefore, the heat transfer efficiency can be improved as compared to a liquid flow by the natural convection and a laminar flow when fluid is flowed merely on the surface of the overmold 4.

In FIG. 5, the plate member 12 is spaced apart from and substantially parallel to the surface 4a of the overmold 4. Alternatively, the plate member 12 may be spaced apart from and substantially parallel to the surface 9a of the heat radiating member 9 of the DRAM 11 so that cooling fluid can be flowed between the plate member 12 and the heat radiating member 9.

In the first through third embodiments, the substrate is the DRAM 11 having a plurality of semiconductor chips 1. Alternatively, the substrate may be the DRAM 11 having a single semiconductor chip 1.

In the first through third embodiments, the semiconductor device 10 comprises the DRAM 11. In place of or in addition to this, the present invention can be applied to a semiconductor device comprising a substrate such as a CPU or a GPU other than the DRAM 11. In such a case, a CPU and a GPU can be formed by stacking a plurality of semiconductor chips as the DRAM 11 according to the above embodiments.

In the first through third embodiments, the heat radiating member 9 that is a different member from the plurality of semiconductor chips 1 is joined to the semiconductor chips 1.

Alternatively, among the stacked semiconductor chips 1, one of the upmost and downmost layers is formed with a semiconductor chip having a radiation function for radiating heat from the other semiconductor chips. The semiconductor chip having a radiation function may be used as the heat radiating member.

EXAMPLES

Figure 7:
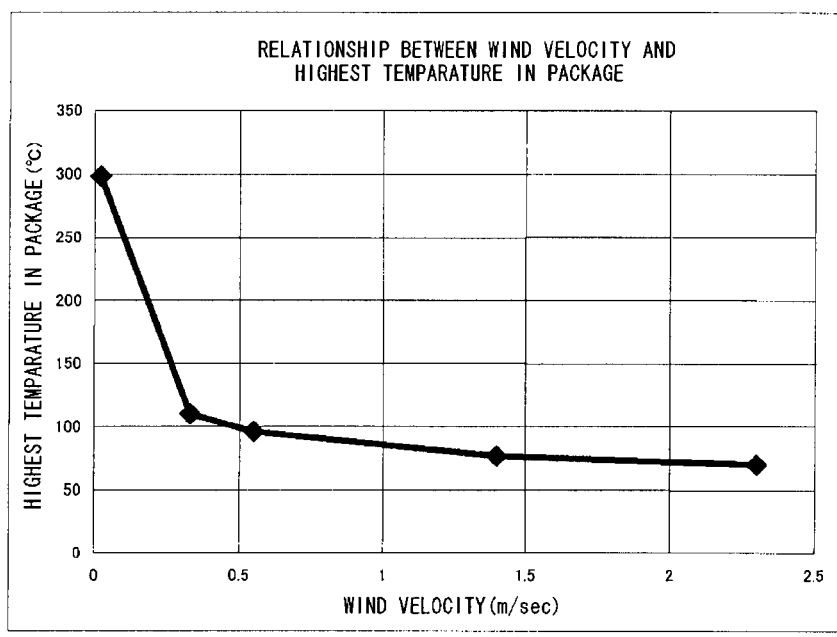
FIG. 7 is a graph showing a simulation result of a relationship between a wind velocity and a highest temperature in a package when cooling wind is blown to the surface of a heat radiating member of the semiconductor device shown in FIG. 1.

An example according to the present invention will be described. A graph shown in FIG. 7 is a result of simulating a relationship between a wind velocity and a highest temperature in a package of the DRAM 11 when cooling wind is blown to the surface of the heat radiating member 9 of the DRAM 11 shown in FIG. 1. Conditions of the simulation are that the heat radiation area of the surface 9a of the heat radiating member 9 is 0.000144 m$^2$, and the cooling wind is blown along the surface 9a of the heat radiating member 9. It should be noted that, when the wind velocity is 0.022 m/sec, the volume of the wind is at a level corresponding to the natural convection without a cooling fan. The wind blows equally in all directions.

Figure 8:
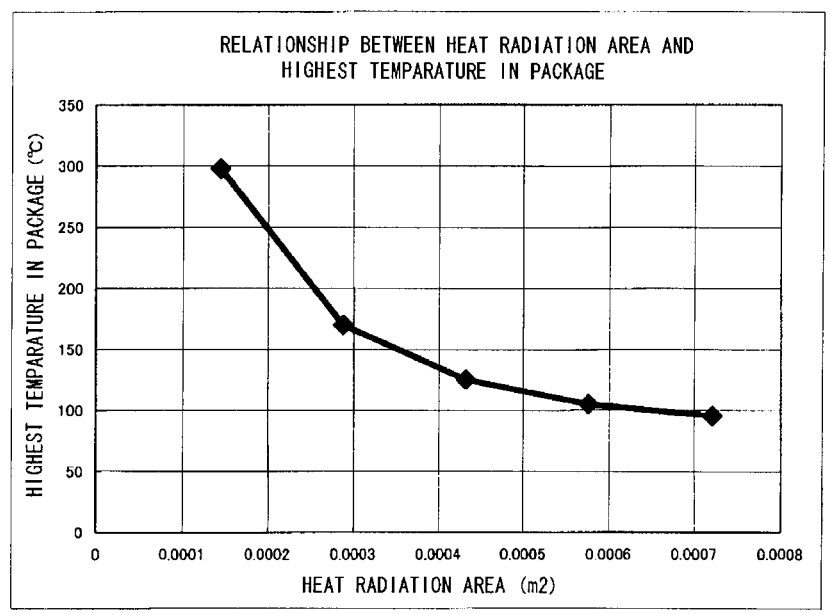
FIG. 8 is a graph showing a simulation result of a relationship between a heat radiation area of the surface of a heat radiating member provided in a DRAM shown in FIG. 1 and a highest temperature in a package.

A graph shown in FIG. 8 is a result of simulating a relationship between a heat radiation area of the surface 9a of the heat radiating member 9 provided in the DRAM 11 shown in FIG. 1 and the highest temperature in the package of the DRAM 11. Conditions of the simulation are that wind generated by the natural convection (wind velocity is 0.022 m/sec) is blown to the surface 9a of the heat radiating member 9 without blowing cooling wind from the external to the surface 9a of the heat radiating member 9 and that the wind blows equally in all directions.

As seen from FIGS. 7 and 8, when the heat radiation area of the surface 9a of the heat radiating member 9 is 0.000144 m$^2$, the highest temperature in the package does not decrease below 100° C. unless wind having a velocity of about 0.5 m/sec or more is blown to the surface 9a of the heat radiating member 9. However, when the heat radiation area of the surface 9a of the heat radiating member 9 is 0.00065 m$^2$ or more, the highest temperature in the package can be decreased below 100° C. only by wind generated by the natural convection, without blowing wind from the external to the surface 9a of the heat radiating member 9.

The invention claimed is:

1. A semiconductor device comprising:
   a substrate;
   a penetrating member penetrating the substrate;
   a heat radiating member joined to the penetrating member for radiating heat of the substrate; and
   a protection member surrounding the substrate and the heat radiating member for protecting the substrate,
   wherein at least a part of the heat radiating member is exposed from the protection member.

2. The semiconductor device according to claim 1, wherein the substrate includes stacked semiconductor chips and the penetrating member penetrates the semiconductor chips.

3. The semiconductor device according to claim 1,
   wherein a thermal conductivity of the penetrating member is higher than a thermal conductivity of the protection member.

4. The semiconductor device according to claim 1, further comprising a plate member disposed above the heat radiating member to form a space between the plate member and the heat radiating member, the plate member being substantially parallel to the heat radiating member.

5. The semiconductor device according to claim 2, wherein the semiconductor chips are separated by at least a gap,
   the semiconductor device further comprising a resin adhesive surrounding the substrate and filling the gap, wherein at least a part of the heat radiating member is exposed from the resin adhesive.

6. A semiconductor device comprising:
   a substrate;
   a penetrating member penetrating through the substrate; and
   a protection member surrounding the substrate, a surface of the protection member comprising projections and depressions,
   wherein a portion of the protection member is in contact with the penetrating member.

7. The semiconductor device according to claim 6, wherein a plate member is disposed above the projections and depressions to form a space between the plate member and the surface of the protection member, the plate member being substantially parallel to the surface of the protection member.

8. The semiconductor device according to any one of claims 1, 2, 3, and 4-7, wherein the substrate is a DRAM.

9. A method for manufacturing a semiconductor device, comprising:
   providing a first thermal conductor in a first substrate;
   superposing the first substrate and a heat radiating member for radiating heat of the substrate;
   coupling the first thermal conductor to the heat radiating member;
   surrounding the first substrate and the heat radiating member with a protection member; and
   exposing at least a part of the heat radiating member from the protection member by removing a part of the protection member.

10. The method according to claim 9, further comprising:
    providing a second thermal conductor in a second substrate;
    superposing the first substrate over the second substrate; and
    coupling the substrates by bonding the thermal conductors provided respectively in the substrates.

11. The method according to claim 9, further comprising:
    providing a second thermal conductor in the heat radiating member; and
    coupling the first substrate and the heat radiating member by bonding the first and second thermal conductors.

12. A semiconductor device comprising:
    a substrate including a plurality of stacked semiconductor chips;
    a penetrating member penetrating the plurality of stacked semiconductor chips;
    a heat radiating member joined to the penetrating member for radiating heat of the plurality of stacked semiconductor chips; and
    an adhesive resin filled between the plurality of stacked semiconductor chips.

13. The semiconductor device according to claim 12, wherein:
    the adhesive resin surrounds the plurality of stacked semiconductor chips and the heat radiating member; and
    at least a part of the heat radiating member is exposed from the adhesive resin.

* * * * *